United States Patent
Hwang et al.

(10) Patent No.: US 11,450,831 B2
(45) Date of Patent: Sep. 20, 2022

(54) DISPLAY DEVICE WITH INPUT SENSING MEMBER AND RESIN LAYER THEREIN

(71) Applicant: SAMSUNG DISPLAY CO., LTD., Yongin-Si (KR)

(72) Inventors: Hyunmin Hwang, Yongin-Si (KR); Youngmin Kim, Yongin-Si (KR); Jawoon Lee, Yongin-Si (KR); Jinhwan Jeon, Yongin-Si (KR); Minjun Jo, Yongin-Si (KR); Dongwon Han, Yongin-Si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 111 days.

(21) Appl. No.: 16/709,572

(22) Filed: Dec. 10, 2019

(65) Prior Publication Data
US 2020/0295294 A1 Sep. 17, 2020

(30) Foreign Application Priority Data
Mar. 12, 2019 (KR) .................. 10-2019-0028157

(51) Int. Cl.
*H01L 51/52* (2006.01)
*H01L 27/32* (2006.01)

(52) U.S. Cl.
CPC ........ *H01L 51/5237* (2013.01); *H01L 27/323* (2013.01)

(58) Field of Classification Search
CPC .......................... H01L 51/5237; H01L 27/323
USPC ............................................ 257/40, 88, 100
See application file for complete search history.

(56) References Cited

U.S. PATENT DOCUMENTS

| 8,721,389 B2 | 5/2014 | Jung et al. |
| 8,721,392 B2 | 5/2014 | Brown et al. |
| 8,854,591 B2 | 10/2014 | Liu et al. |
| 9,474,125 B2 | 10/2016 | Kim et al. |

(Continued)

FOREIGN PATENT DOCUMENTS

| KR | 1020110066326 | 6/2011 |
| KR | 1020146084919 | 7/2014 |

(Continued)

OTHER PUBLICATIONS

U.S. Appl. No. 16/735,217 Office Action dated Nov. 23, 2021.

(Continued)

*Primary Examiner* — Matthew E. Gordon
(74) *Attorney, Agent, or Firm* — F. Chau & Associates, LLC

(57) ABSTRACT

A display device includes a display panel that includes a substrate, a display layer disposed on the substrate, and a thin-film encapsulation layer that covers the display layer; an input sensing member that includes a base layer and sensing electrodes disposed on the base layer, wherein the base layer faces the substrate of the display panel; and a resin layer disposed between the thin-film encapsulation layer and the base layer. The display device includes an opening area and a display area that at least partially surrounds the opening area. A side surface of the substrate that at least partially surrounds the opening area has a shape in a thickness direction of the substrate that differs from a shape in the thickness direction of a side surface of another part of the substrate.

20 Claims, 20 Drawing Sheets

(56) References Cited

U.S. PATENT DOCUMENTS

| | | | |
|---|---|---|---|
| 9,720,268 B2 | 3/2017 | Liu et al. | |
| 2002/0131008 A1* | 9/2002 | Iwase | H01L 51/5228 |
| | | | 349/153 |
| 2015/0097810 A1 | 4/2015 | Aoki et al. | |
| 2017/0287992 A1* | 10/2017 | Kwak | G06F 1/1686 |
| 2018/0013096 A1 | 1/2018 | Hamada et al. | |
| 2018/0061897 A1* | 3/2018 | Oh | G06F 3/0443 |
| 2018/0155238 A1 | 6/2018 | Kim | |
| 2018/0188868 A1 | 7/2018 | Heo et al. | |
| 2018/0307088 A1 | 10/2018 | Liu et al. | |
| 2019/0129564 A1 | 6/2019 | Kim | |
| 2019/0179466 A1* | 6/2019 | Kim | G06F 3/0443 |
| 2019/0227361 A1* | 7/2019 | Yueh | H01L 27/3234 |
| 2020/0343478 A1* | 10/2020 | Hwang | H01L 51/0096 |

FOREIGN PATENT DOCUMENTS

| | | |
|---|---|---|
| KR | 10-2016-0012378 | 2/2016 |
| KR | 10-2016-0012412 | 2/2016 |
| KR | 10-1633118 | 6/2016 |
| KR | 1020160073531 | 6/2016 |
| KR | 1020180077917 | 7/2018 |
| KR | 10-1908503 | 10/2018 |

OTHER PUBLICATIONS

U.S. Appl. No. 16/735,217 Office Action dated Nov. 12, 2020.
U.S. Appl. No. 16/735,217 Final Office Action dated May 13, 2021.
U.S. Appl. No. 16/735,217 Advisory Action dated Jul. 19, 2021.
U.S. Appl. No. 16/735,217 Office Action dated Feb. 28, 2022.

\* cited by examiner

DISPLAY DEVICE WITH INPUT SENSING MEMBER AND RESIN LAYER THEREIN

CROSS-REFERENCE TO RELATED APPLICATION

This application claims, priority under 35 U.S.C. § 119 from, and the benefit of, Korean Patent Application No. 10-2019-0028157, filed on Mar. 12, 2019 in the Korean Intellectual Property Office, the contents of which are herein incorporated by reference in their entirety.

BACKGROUND

1. Technical Field

One or more embodiments are directed to a display device.

2. Discussion of the Related Art

Recently, the use of display devices has become diverse. In addition, the thicknesses and weights of display devices have decreased, and thus, the range of their use has increased. As the sizes of display areas of the display devices have increased, display devices have taken on a variety of additional combined or connecting functions.

SUMMARY

One or more embodiments include a display device having an opening area and a manufacturing process thereof.

According to one or more embodiments, a display device includes: a display panel that includes a substrate, a display layer disposed on the substrate, and a thin-film encapsulation layer that covers the display layer; an input sensing member that includes a base layer and sensing electrodes disposed on the base layer, where the base layer faces the substrate of the display panel; and a resin layer disposed between the thin-film encapsulation layer and the base layer.

The resin layer may include an ultraviolet (UV) curable material.

The resin layer may extend toward an edge of the substrate beyond an edge of the thin-film encapsulation layer.

The thin-film encapsulation layer may include at least one inorganic encapsulation layer and at least one organic encapsulation layer.

The input sensing member may include a first conductive layer, a second conductive layer disposed on the first conductive layer, and a first insulating layer disposed between the first conductive layer and the second conductive layer.

The first conductive layer may be in direct contact with the base layer.

The display device may include an opening area and a display area that at least partially surrounds the opening area. A side surface of the substrate that at least partially surrounds the opening area may have a shape that differs from a shape of a side surface of another part of the substrate, and a side surface of the base layer that at least partially surrounds the opening area may have a shape that differs from a shape of a side surface of another part of the base layer.

A side surface of the resin layer may form a continuous surface with side surfaces of the substrate and the base layer.

A side surface of the resin layer may be spaced inward toward display layer from side surfaces of the substrate and the base layer.

According to one or more embodiments, a display device includes: a substrate that includes a first inner surface and a first outer surface that is opposite to the first inner surface; a display layer disposed on the first inner surface of the substrate; a thin-film encapsulation layer that covers the display layer; a base layer that includes a second inner surface that faces the first inner surface and a second outer surface that is opposite to the second inner surface; and a resin layer disposed between the thin-film encapsulation layer and the base layer.

The resin layer may be transparent and may include a UV curable resin.

The resin layer may extend toward an edge of the substrate and an edge of the base layer beyond an edge of the thin-film encapsulation layer.

The display device may further include a sensor layer positioned on the base layer and that includes first sensing electrodes and second sensing electrodes.

The display device may include an opening area and a display area that at least partially surrounds the opening area, the substrate may include a first side surface that at least partially surrounds the opening area and a second side surface that differs from the first side surface, and the base layer may include a third side surface that at least partially surrounds the opening area and a fourth side surface that differs from the third side surface. The first side surface may have a shape that differs from that of the second side surface, and the third side surface may have a shape that differs from that of the fourth side surface.

The first side surface of the substrate may include a first inclined surface adjacent to the first outer surface of the substrate, and the third side surface of the base layer may include a second inclined surface adjacent to the second outer surface of the base layer.

The second side surface of the substrate may include a first curved surface adjacent to the first inner surface of the substrate, and the fourth side surface of the base layer may include a second curved surface adjacent to the second inner surface of the base layer.

A side surface of the resin layer may form a continuous surface with the first side surface and the second side surface.

A side surface of the resin layer may form a continuous surface with the third side surface and the fourth side surface or may be positioned inward from the third side surface and the fourth side surface.

According to one or more embodiments, a display device includes a substrate that includes a first inner surface and a first outer surface that is opposite to the first inner surface, a base layer that includes a second inner surface that faces the first inner surface and a second outer surface that is opposite to the second inner surface. The display device includes an opening area and a display area that at least partially surrounds the opening area. The substrate includes a first side surface that at least partially surrounds the opening area and a second side surface that differs from the first side surface, and the base layer includes a third side surface that at least partially surrounds the opening area and a fourth side surface that differs from the third side surface. The first side surface has a shape that differs from that of the second side surface, and the third side surface has a shape that differs from that of the fourth side surface.

The display device may further includes a display layer disposed on the first inner surface of the substrate, a thin-film encapsulation layer that covers the display layer, and a resin layer disposed between the thin-film encapsulation layer and the base layer.

DETAILED DESCRIPTION

Figure 1:
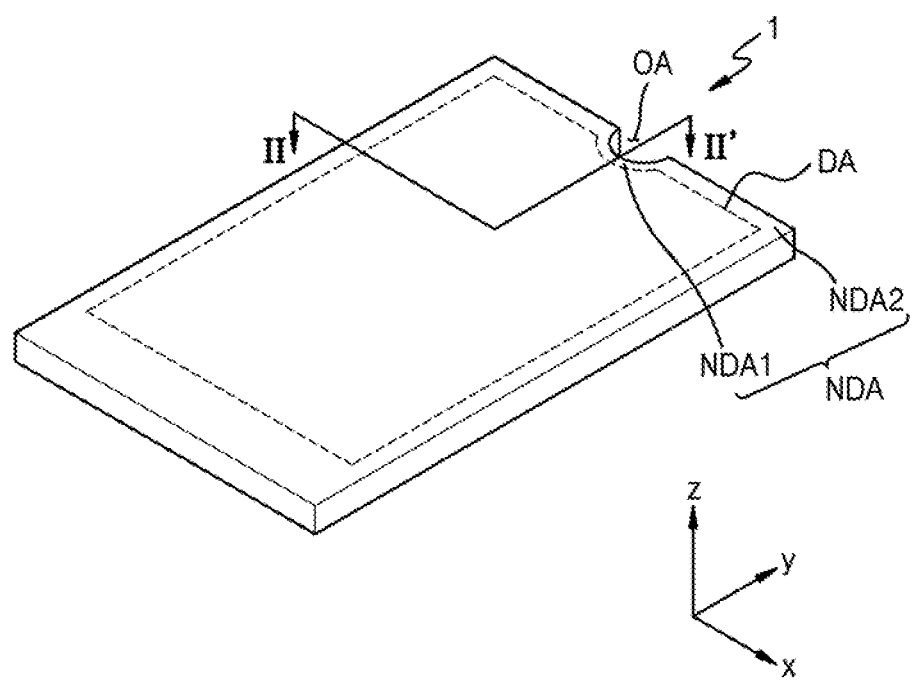
FIG. 1 is a perspective view of a display device according to an embodiment.

Reference will now be made in detail to exemplary embodiments, examples of which are illustrated in the accompanying drawings, wherein like reference numerals may refer to like elements throughout. In this regard, the present embodiments may have different forms and should not be construed as being limited to the descriptions set forth herein. Accordingly, the embodiments are merely described below, by referring to the figures, to explain aspects of the present description.

Hereinafter, embodiments of the present disclosure will be described below in more detail with reference to the accompanying drawings. Those components that are the same or are in correspondence may be identified by the same reference numeral regardless of the figure number, and a redundant description therewith is omitted.

It will be understood that when a layer, region, or component is referred to as being "formed on," another layer, region, or component, it may be directly or indirectly formed on the other layer, region, or component.

Sizes of elements in the drawings may be exaggerated for convenience of explanation.

It will be understood that when a layer, a region, or an element is referred to as being "connected to" another layer, another region, or another element, it may be directly connected to the other layer, region, or element or intervening layers, regions, or elements may be present.

FIG. 1 is a perspective view of a display device according to an embodiment.

Referring to FIG. 1, according to an embodiment, a display device 1 includes a display area DA and a non-display area NDA. The display device 1 displays an image using light emitted from a plurality of pixels disposed in the display area DA. The display device 1 includes an opening area OA formed at an edge of the display area DA and that is at least partially surrounded by the display area DA.

According to an embodiment, the non-display area NDA has no pixels disposed thereon and surrounds the display area DA. A part of the non-display area NDA is located between the display area DA and the opening area OA. Hereinafter, for convenience of explanation, an portion of the non-display area NDA between the display area DA and the opening area OA is referred to as a first non-display area NDA1, and the other portion thereof is referred to as a second non-display area NDA2.

Hereinafter, the display device 1 according to an embodiment is described with reference to an organic light-emitting display device (OLED). However, display devices according to embodiments are not limited thereto. In other embodiments, other types of display devices, such as an inorganic electroluminescence display device or a quantum dot light-emitting display device, may be used. In an embodiment, each pixel of the display device 1 includes a display element that includes an emission layer. The emission layer may include an organic material, an inorganic material, a quantum dot, both an organic material and a quantum dot, or both an inorganic material and a quantum dot.

Figure 2:
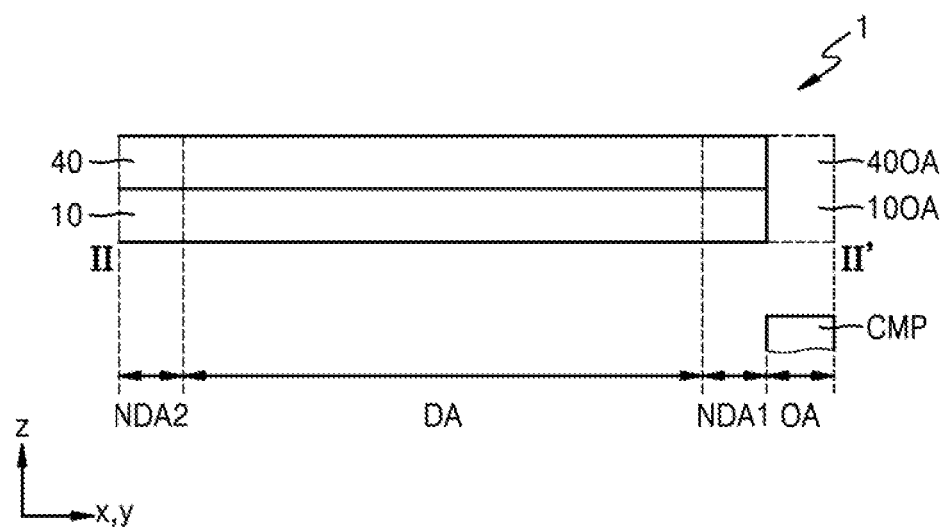
FIG. 2 is a cross-sectional view of a display device according to an embodiment.

FIG. 2 is a cross-sectional view of a display device according to an embodiment, which corresponds to a cross-sectional view taken along a line II-II' of FIG. 1.

Referring to FIG. 2, according to an embodiment, the display device 1 includes a display panel 10 and an input sensing member 40. The display panel 10 displays an image using the plurality of pixels disposed in the display area DA.

According to an embodiment, the input sensing member 40 acquires coordinate information from an external input, such as a touch event. The input sensing member 40 includes a sensing or touch electrode and trace or signal lines connected to the sensing electrode. The input sensing member 40 is positioned on the display panel 10.

According to an embodiment, each of the display panel 10 and the input sensing member 40 includes an opening that corresponds to the opening area OA. An opening 10OA of the display panel 10 and an opening 40OA of the input sensing member 40 are positioned in the opening area OA and overlap each other.

According to an embodiment, the opening area OA is a component area in which a component CMP that adds various functions to the display device 1 can be positioned. The component CMP includes an electronic component. The component CMP is an electronic component that uses light or sound. For example, the electronic component may include a sensor that outputs or receives light, such as an infrared sensor, a camera that receives light to capture an image, a sensor that outputs light or sound to measure a distance or recognize a finger print, a lamp that outputs light, or a speaker that outputs sound. Those electronic component that output or receive light use light in a particular wavelength band, such as visible light, infrared light, or ultraviolet (UV) light. In some embodiments, the opening area OA is a transmission area through which light or sound is emitted from the component or propagates toward the electronic component from the outside.

According to an embodiment, when the display device 1 provides particular information, like in a smart watch or a dash board for a vehicle, the component CMP may be a member such as a needle that indicates information, for example, a vehicle speed, the amount of lubrication, time, etc. Alternatively, the component CMP may be a component, such as a lamp or an accessory that increases an esthetic sense of the display device 1.

Figure 3:
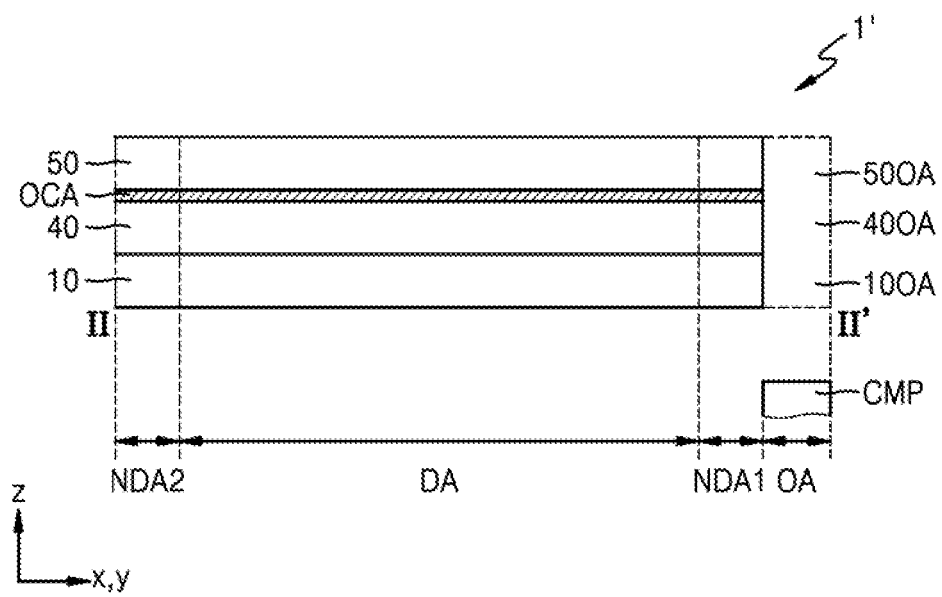
FIG. 3 is a cross-sectional view of a display device according to another embodiment.

FIG. 3 is a cross-sectional view schematically illustrating a display device according to another embodiment.

Referring to FIG. 3, according to an embodiment, a display device 1' further includes an optical function member 50 positioned on the input sensing member 40. The optical function member 50 may reduce reflectivity of external light incident toward the display panel 10 or may improve color purity of light emitted from the display panel 10.

In an embodiment, the optical function member 50 includes a retarder and a polarizer. The retarder may be a film type or a liquid crystal coating type and may include a λ/2 retarder or a λ/4 retarder. The polarizer may also be a film type or a liquid crystal coating type. A film type polarizer includes an elongation type synthetic resin film, and the liquid crystal coating type polarizer includes liquid crystals positioned in a predetermined arrangement. The retarder and the polarizer may further include a protective film. The retarder and the polarizer itself or the protective film form a base layer of the optical function member 50.

In another embodiment, the optical function member 50 further includes a black matrix and color filters. The color filters are based on the color of light emitted from each of the pixels of the display panel 10. Each of the color filters includes a red, green, or blue pigment or dye. Alternatively, each of the color filters further includes quantum dots. Alternatively, some of the color filters do not include the above-described pigment or dye and instead include scattered particles, such as titanium oxide.

In another embodiment, the optical function member 50 includes a destructive interference structure. A destructive interference structure includes a first reflection layer and a second reflection layer arranged on different layers. A first reflected light and a second reflected light, which are respectively reflected from the first reflection layer and the second reflection layer, destructively interfere with each other. Thus, reflectivity of external light can be reduced.

According to an embodiment, a process that forms the optical function member 50 is performed separately from a process that forms the input sensing member 40. In this case, an adhesive film, such as an optical clear adhesive (OCA), is interposed between the optical function member 50 and the input sensing member 40. In another embodiment, the process that forms the optical function member 50 is continuously performed after a process that forms the input sensing member 40 is performed. In this case, no adhesive film is interposed between the optical function member 50 and the input sensing member 40.

According to an embodiment, like the display panel 10 and the input sensing member 40, the optical function member 50 includes an opening 50OA that corresponds to the opening area OA. Each of the opening 10OA of the display panel 10, the opening 40OA of the input sensing member 40, and the opening 50OA of the optical function member 50 are formed in the opening area OA and overlap each other.

Figure 4:
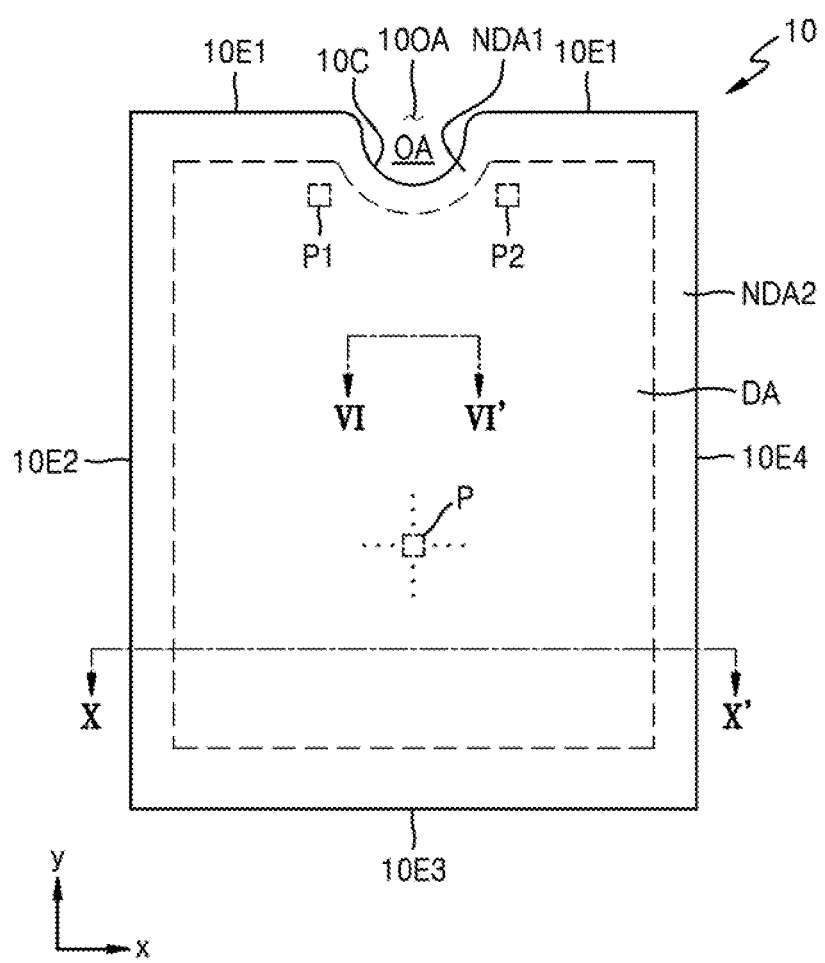
FIG. 4 is a plan view of a display panel according to an embodiment.

FIG. 4 is a plan view of a display panel according to an embodiment.

Referring to FIG. 4, according to an embodiment, a display panel 10 includes a display area DA, an opening area OA, a first non-display area NDA1, and a second non-display area NDA2. The opening area OA is formed at one side of the display panel 10. The opening area OA is partially surrounded by the display area DA. A first pixel P1 and a second pixel P2 of the pixels P disposed in the display area DA are spaced apart from each other with the opening area OA therebetween.

According to an embodiment, the display panel 10 includes an opening 10OA in the opening area OA. The opening 10OA penetrates through the display panel 10. The opening 10OA is formed when portions of components of the display panel 10 that correspond to the opening area OA are removed. The display panel 10 includes a first edge 10E1, a second edge 10E2, a third edge 10E3, and a fourth edge 10E4 arranged counterclockwise. In addition, a corner edge between the first edge 10E1 and the second edge 10E2 may be rounded. Similarly, corner edges between the second edge 10E2 and the third edge 10E3, between the third edge 10E3 and the fourth edge 10E4, and between the fourth edge 10E4 and the first edge 10E1, respectively, may be rounded.

According to an embodiment, the display panel 10 with the opening 10OA includes a rounded edge 10C that is concave toward the display area DA. The rounded edge 10C is a boundary of the opening 10OA and is connected to the first edge 10E1.

Figure 5:
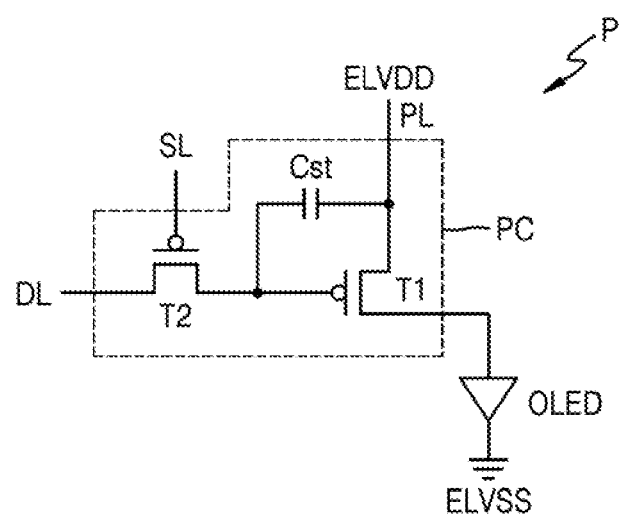
FIG. 5 is an equivalent circuit diagram of a pixel of a display panel according to an embodiment.

FIG. 5 is an equivalent circuit diagram of a pixel of a display panel according to an embodiment.

According to an embodiment, each pixel P includes a pixel circuit PC and a display element, such as an organic light-emitting display diode (OLED), connected to the pixel circuit PC. The pixel circuit PC includes a first thin-film transistor (TFT) T1, a second TFT T2, and a storage capacitor Cst. Each pixel P emits one of red, green, blue, or white light through the OLED.

According to an embodiment, the second TFT T2 is a switching thin-film transistor, is connected to a scan line SL and a data line DL and transmits a data voltage received from the data line DL to the first TFT T1 based on a switching voltage received from the scan line SL. The storage capacitor Cst is connected to the second TFT T2 and a driving voltage line PL and stores a voltage that corresponds to a difference between a voltage received from the second TFT T2 and a first power supply voltage ELVDD supplied to the driving voltage line PL.

According to an embodiment, the first TFT T1 is a driving TFT, is connected to the driving voltage line PL and the storage capacitor Cst and controls a driving current that flows through the OLED from the driving voltage line PL in response to a voltage value stored in the storage capacitor Cst. The OLED emits light whose brightness corresponds to the driving current. An opposite electrode, such as a cathode of the OLED, receives a second power supply voltage ELVSS.

According to an embodiment, FIG. 5 illustrates the pixel circuit PC that includes two TFTs and one storage capacitor. However, embodiments are not limited thereto. In other embodiments, the number of TFTs and the number of storage capacitors can vary according to a design of the pixel circuit PC. For example, the pixel circuit PC may further include four or five or more TFTs.

Figure 6:
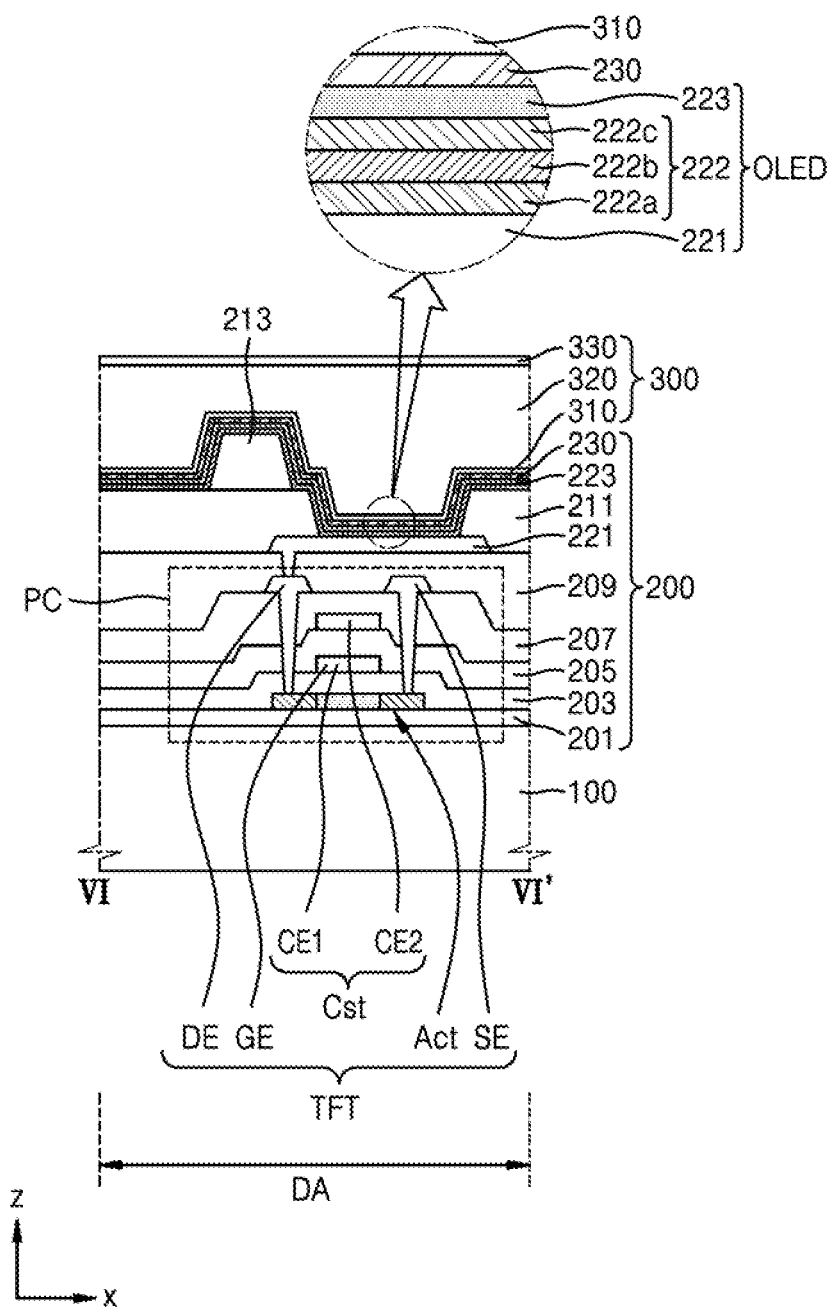
FIG. 6 is a cross-sectional view of a pixel of a display panel according to an embodiment.

FIG. 6 is a cross-sectional view of a pixel of a display panel according to an embodiment, which corresponds to a cross-section taken along a line VI-VI' of FIG. 4.

Referring to FIG. 6, according to an embodiment, the pixel circuit PC and the OLED as a display element connected to the pixel circuit PC are positioned on the substrate 100.

According to an embodiment, the substrate 100 includes a glass material or resin material. For example, the substrate 100 is a glass substrate whose main ingredient is silicon dioxide ($SiO_2$).

According to an embodiment, a buffer layer 201 is formed on the substrate 100 to prevent impurities from penetrating into a semiconductor layer Act of the TFT. The buffer layer 201 includes an inorganic material, such as silicon nitride or silicon oxide, and may have a single layer or a multi-layer structure that includes one or more of the above-described inorganic insulating material.

According to an embodiment, the pixel circuit PC is positioned on the buffer layer 201. The pixel circuit PC includes a TFT and a storage capacitor Cst. The TFT includes the semiconductor layer Act, a gate electrode GE, a source electrode SE, and a drain electrode DE. In a present embodiment, the TFT may be a top gate type in which the gate electrode GE is positioned on the semiconductor layer Act with a gate insulating layer 203 therebetween. However, in another embodiment, the TFT may be a bottom gate type.

According to an embodiment, the semiconductor layer Act includes polysilicon. Alternatively, in another embodiment, the semiconductor layer Act may include amorphous silicon, an oxide semiconductor, or an organic semiconductor. The gate electrode GE includes a low resistance metal. The gate electrode GE includes a conductive material such as molybdenum (Mo), aluminum (Al), copper (Cu), or titanium (Ti), etc., and may have a multi-layer or a single layer structure that includes one or more of the above-described materials.

According to an embodiment, the gate insulating layer 203 disposed between the semiconductor layer Act and the gate electrode GE includes an inorganic insulating material, such as silicon oxide, silicon nitride, silicon oxynitride, aluminum oxide, titanium oxide, tantalum oxide, or hafnium oxide, etc. The gate insulating layer 203 may have a single layer or a multi-layer structure that includes one or more of the above-described materials.

According to an embodiment, the source electrode SE and the drain electrode DE include a highly conductive material. The source electrode SE and the drain electrode DE include a conductive material such as Mo, Al, Cu, or Ti, etc., and may have a multi-layer or a single layer structure that includes one or more of the above-described materials. In an embodiment, the source electrode SE and the drain electrode DE have a multi-layer structure of Ti/Al/Ti.

According to an embodiment, the storage capacitor Cst includes a lower electrode CE1 and an upper electrode CE2 that overlap each other with a first interlayer insulating layer 205 therebetween. The storage capacitor Cst overlaps the TFT. In this regard, FIG. 6 illustrates that the gate electrode GE of the TFT is the lower electrode CE1 of the storage capacitor Cst. In another embodiment, the storage capacitor Cst does not overlap the TFT. The storage capacitor Cst is covered with a second interlayer insulating layer 207.

According to an embodiment, the first interlayer insulating layer 205 and the second interlayer insulating layer 207 include an inorganic insulating material, such as silicon oxide, silicon nitride, silicon oxynitride, aluminum oxide, titanium oxide, tantalum oxide, or hafnium oxide. The first interlayer insulating layer 205 and the second interlayer insulating layer 207 may have a single layer or a multi-layer structure that includes one or more of the above-described materials.

According to an embodiment, the pixel circuit PC that includes the thin-film transistor TFT and the storage capacitor Cst is covered with a planarization insulating layer 209. The planarization insulating layer 209 includes an approximately flat top surface. The planarization insulating layer 209 may include an organic insulating material, such as a general purpose polymer, such as polymethylmethacrylate (PMMA) or polystyrene (PS), a polymer derivative that has a phenol-based group, an acryl-based polymer, an imide-based polymer, an aryl ether-based polymer, an amide-based polymer, a fluorine-based polymer, a p-xylene-based polymer, a vinyl alcohol-based polymer, or a blend thereof. In an embodiment, the planarization insulating layer 209 includes polyimide. In another embodiment, the planarization insulating layer 209 includes an inorganic insulating material, or an inorganic and organic insulating material.

According to an embodiment, a pixel electrode 221 is formed on the planarization insulating layer 209. The pixel electrode 221 includes a conductive oxide, such as indium tin oxide (ITO), indium zinc oxide (IZO), zinc oxide (ZnO), indium oxide ($In_2O_3$), indium gallium oxide (IGO), or aluminum zinc oxide (AZO). In another embodiment, the pixel electrode 221 include a reflective layer that includes silver (Ag), magnesium (Mg), aluminum (Al), platinum (Pt), palladium (Pd), gold (Au), nickel (Ni), neodymium (Nd), iridium (Ir), chromium (Cr), or a compound thereof. In another embodiment, the pixel electrode 221 further includes a layer formed of ITO, IZO, ZnO or $In_2O_3$ on or under the above-described reflection layer.

According to an embodiment, a pixel-defining layer 211 is formed on the pixel electrode 221. The pixel-defining layer 211 includes an opening that exposes a top surface of the pixel electrode 221 and that covers edges of the pixel electrode 221. The pixel-defining layer 211 includes an organic insulating material. In another embodiment, the pixel-defining layer 211 includes an inorganic insulating material, such as silicon nitride, silicon oxynitride, or silicon oxide. In another embodiment, the pixel-defining layer 211 includes an organic insulating material and an inorganic insulating material.

According to an embodiment, an intermediate layer 222 that includes an emission layer 222b is formed on the pixel-defining layer 211 and the pixel electrode 221. The intermediate layer 222 includes a first functional layer 222a positioned under the emission layer 222b or a second functional layer 222c positioned above the emission layer 222b. The emission layer 222b includes a polymer or a small molecular weight organic material that emits light having a predetermined color.

According to an embodiment, the first functional layer 222a may have a single layer or a multi-layer structure. For example, when the first functional layer 222a is formed of a polymer material, the first functional layer 222a is a hole transport layer (HTL) that has a single-layer structure formed of poly-(3,4)-ethylene-dihydroxy thiophene (PEDOT) or polyaniline (PANI). When the first functional layer 222a is formed of a small molecular weight material, the first functional layer 222a includes a hole injection layer (HIL) and a HTL.

According to an embodiment, the second functional layer 222c is optional. For example, when the first functional layer 222a and the emission layer 222b are formed of a polymer material, the second functional layer 222c is formed. The second functional layer 222c may have a single layer or a multi-layer structure. The second functional layer 222c may include an electron transport layer (ETL) or an electron injection layer (EIL).

According to an embodiment, the emission layer 222b of the intermediate layer 222 is positioned in each pixel of the display area DA. Each of the first functional layer 222a and the second functional layer 222c of the intermediate layer 222 is formed of a single body to cover a plurality of pixels.

According to an embodiment, an opposite electrode 223 formed of a low work function conductive material is formed on the intermediate layer 222. For example, the opposite electrode 223 includes a (semi-)transparent layer that includes Ag, Mg, Al, Pt, Pd, Au, Ni, Nd, Ir, Cr, lithium (Li), calcium (Ca), or an alloy thereof. In another embodiment, the opposite electrode 223 further includes a layer formed of ITO, IZO, ZnO, or $In_2O_3$ on the (semi-)transparent layer. The opposite electrode 223 is a single body and is formed in the first non-display area NDA1 in addition to the display area DA. The intermediate layer 222 and the opposite electrode 223 can be formed through thermal deposition.

According to an embodiment, a spacer 213 is formed on the pixel-defining layer 211. The spacer 213 includes an organic insulating material such as polyimide. In another embodiment, the spacer 213 includes an inorganic insulating material such as silicon nitride or silicon oxide, or an organic insulating material and an inorganic insulating material.

According to an embodiment, the spacer 213 includes a material that differs from a material that forms the pixel-defining layer 211. In another embodiment, the spacer 213 includes the same material as the pixel-defining layer 211. In this case, the pixel-defining layer 211 and the spacer 213 can be formed together in a mask process using a halftone mask. In an embodiment, the pixel-defining layer 211 and the spacer 213 include polyimide.

According to an embodiment, a capping layer 230 is positioned on the opposite electrode 223. The capping layer 230 includes lithium fluoride (LiF). In an embodiment, a capping layer 230 is omitted.

According to an embodiment, the layers 201, 203, 205, 207 and 209 of the pixel circuit PC, and the layers 221, 211, 222, and 223 of the display element OLED, and the capping layer 230 make up a display layer 200.

According to an embodiment, a thin-film encapsulation layer 300 covers the OLED. The thin-film encapsulation layer 300 includes at least one inorganic encapsulation layer and at least one organic encapsulation layer. In an embodiment, as shown in FIG. 6, the thin-film encapsulation layer 300 includes a first inorganic encapsulation layer 310, an organic encapsulation layer 320, and a second inorganic encapsulation layer 330, which are sequentially stacked.

According to an embodiment, each of the first and second inorganic encapsulation layers 310 and 330 includes one or more inorganic insulating materials. The inorganic insulating material includes aluminum oxide, titanium oxide, tantalum oxide, hafnium oxide, zinc oxide, silicon oxide, silicon nitride, or silicon oxynitride. The organic encapsulation layer 320 includes a polymer-based material. The polymer-based material includes an acryl-based resin, an epoxy-based resin, polyimide, or polyethylene. The acryl-based resin includes polymethylmethacrylate or polyacrylic acid, for example.

Figure 7:
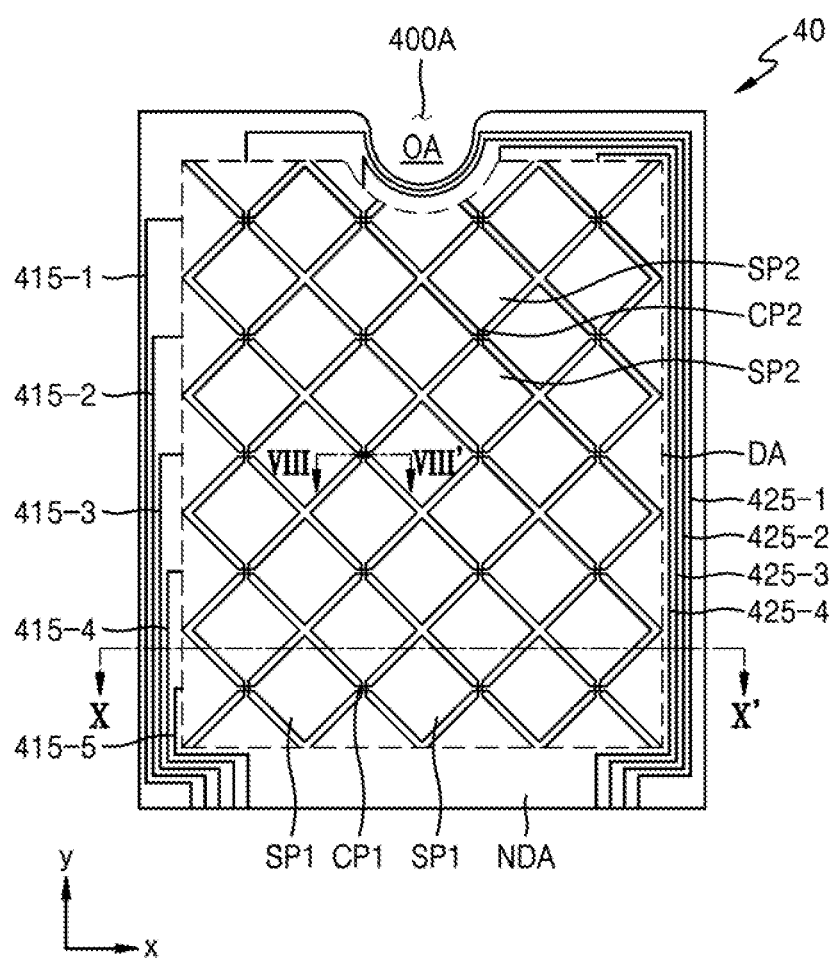
FIG. 7 is a plan view of an input sensing member according to an embodiment.

FIG. 7 is a plan view of an input sensing member according to an embodiment.

Referring to FIG. 7, according to an embodiment, an input sensing member 40 includes first sensing electrodes SP1, first trace lines 415-1, 415-2, 415-3, 415-4, and 415-5 connected to the first sensing electrodes SP1, second sensing electrodes SP2, and second trace lines 425-1, 425-2, 425-3, and 425-4 connected to the second sensing electrodes SP2.

According to an embodiment, the first sensing electrodes SP1 and the second sensing electrodes SP2 are positioned in the display area DA, and the first trace lines 415-1, 415-2, 415-3, 415-4, and 415-5 and the second trace lines 425-1, 425-2, 425-3, and 425-4 are positioned in the non-display area NDA.

According to an embodiment, the first sensing electrodes SP1 extend in an x-direction. Adjacent first sensing electrodes SP1 are connected to each other via a first connection electrode CP1, and the connected first sensing electrodes SP1 and first connection electrodes CP1 form a row. As shown in FIG. 7, the first sensing electrodes SP1 form a plurality of rows. Each of the plurality of rows is connected to one of the first trace lines 415-1, 415-2, 415-3, 415-4, and 415-5.

According to an embodiment, the second sensing electrodes SP2 extend in a y-direction that crosses the x-direction. Adjacent second sensing electrodes SP2 are connected to each other via a second connection electrode CP2. The connected second sensing electrodes SP2 and second connection electrode CP2 form a column. As shown in FIG. 7, the second sensing electrodes SP2 form a plurality of columns. Each of the plurality of columns is connected to one of the second trace lines 425-1, 425-2, 425-3, and 425-4.

Figure 8:
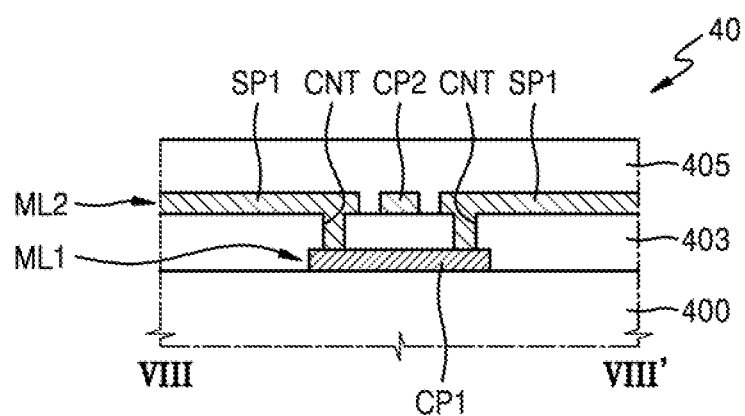
FIG. 8 is a cross-sectional view of an input sensing member according to an embodiment.
Figure 9A:
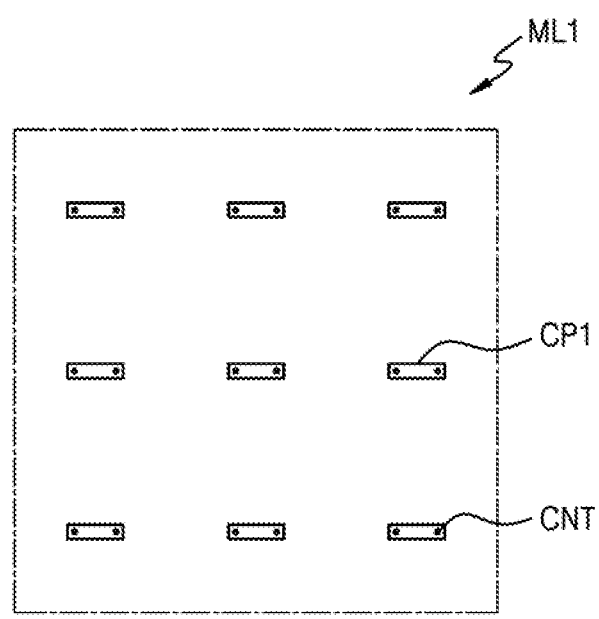
FIG. 9A is a plan view of a first electrode layer of an input sensing member according to an embodiment.
Figure 9B:
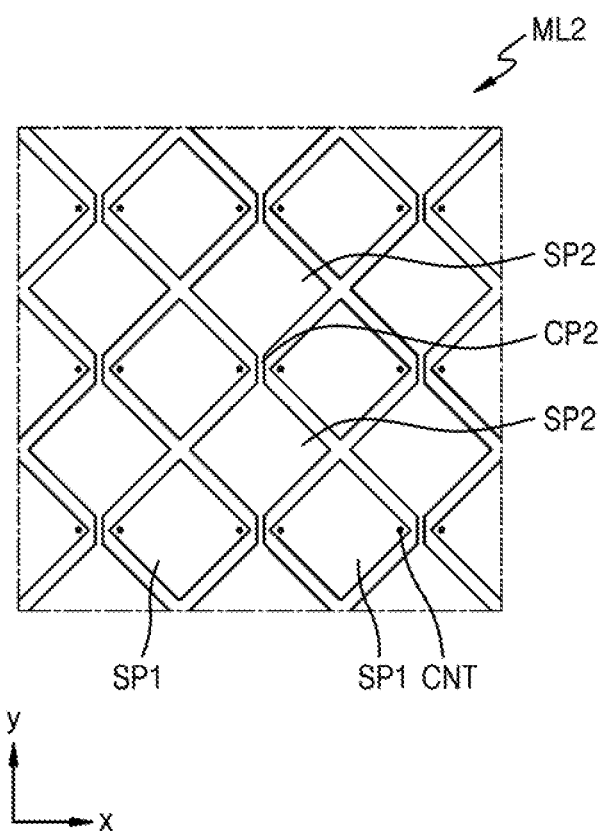
FIG. 9B is a plan view of a second electrode layer of an input sensing member according to an embodiment.

FIG. 8 is a cross-sectional view of an input sensing member according to an embodiment, which corresponds to a cross-sectional view taken along a line VIII-VIII' of FIG. 7. FIG. 9A is a plan view of a first electrode layer of an input sensing member according to an embodiment, and FIG. 9B is a plan view of a second electrode layer of an input sensing member according to an embodiment.

Referring to FIG. 8, according to an embodiment, a first conductive layer ML1 and a second conductive layer ML2 are positioned on a base layer 400. The base layer 400 includes a glass material or a resin material. For example, the base layer 400 is a glass substrate with a main ingredient of $SiO_2$.

According to an embodiment, the first conductive layer ML1 is positioned on the base layer 400 and is in direct contact with a top surface of the base layer 400. The first conductive layer ML1 includes a first connection electrode CP1, as shown in FIG. 9A.

According to an embodiment, the second conductive layer ML2 is positioned on the first conductive layer ML1 with a first insulating layer 403 therebetween. The second conductive layer ML2 is covered with a second insulating layer 405. The first insulating layer 403 and the second insulating layer 405 may include an inorganic material or an organic material or a composite material.

According to an embodiment, the second conductive layer ML2 includes first sensing electrodes SP1, second sensing electrodes SP2, and second connection electrodes CP2, as shown in FIG. 9A. The first sensing electrodes SP1 and the second sensing electrodes SP2 are spaced apart from each other by a predetermined distance. Adjacent second sensing electrodes SP2 are connected to the second connection electrodes CP2 and formed as a single body therewith. Adjacent first sensing electrodes SP1 are connected to the first connection electrodes CP1 via contact holes CNT formed in the first insulating layer 403 and are electrically connected to each other.

According to an embodiment, FIGS. 9A and 9B illustrate that the first sensing electrodes SP1 and the second sensing, electrodes SP2 are provided on the same electrode layer, such as the second conductive layer ML2. However, embodiments are not limited thereto. In another embodiment, the first sensing electrodes SP1 are included in the first conductive layer ML1, and the second sensing electrodes SP2 are included in the second conductive layer ML2. In other embodiments, the first conductive layer ML1 or the second conductive layer ML2 further include auxiliary sensing electrodes that are electrically connected to each other via contact holes in the first insulating layer 403. The auxiliary sensing electrodes are positioned to correspond to the above-described first sensing electrodes SP1 or second sensing electrodes SP2, respectively. In still other embodiments, the first conductive layer ML1 or the second conductive layer ML2 further include dummy sensing electrodes that are electrically insulated from the first sensing electrodes SP1 or the second sensing electrodes SP2.

According to an embodiment, the first conductive layer ML1 and the second conductive layer ML2 include a metallic layer or a transparent conductive layer and may have a single layer or a multi-layer structure that includes one or more of the above-described materials. The metallic layer includes Mo, Ag, Ti, Cu, Al, or an alloy thereof. The transparent conductive layer includes a transparent conductive oxide, such as ITO, IZO, ZnO, or ITZO. The transparent conductive layer may include a conductive polymer, such as PEDOT, a metallic nanowire, or graphene.

Figure 10:
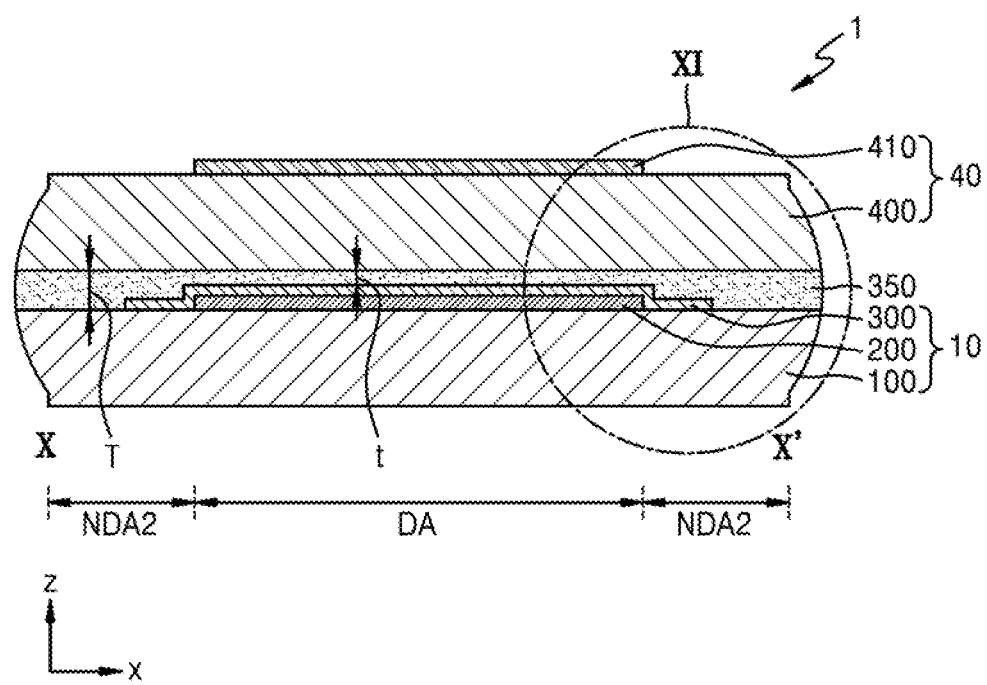
FIG. 10 is a cross-sectional view of a display device according to an embodiment.
Figure 11:
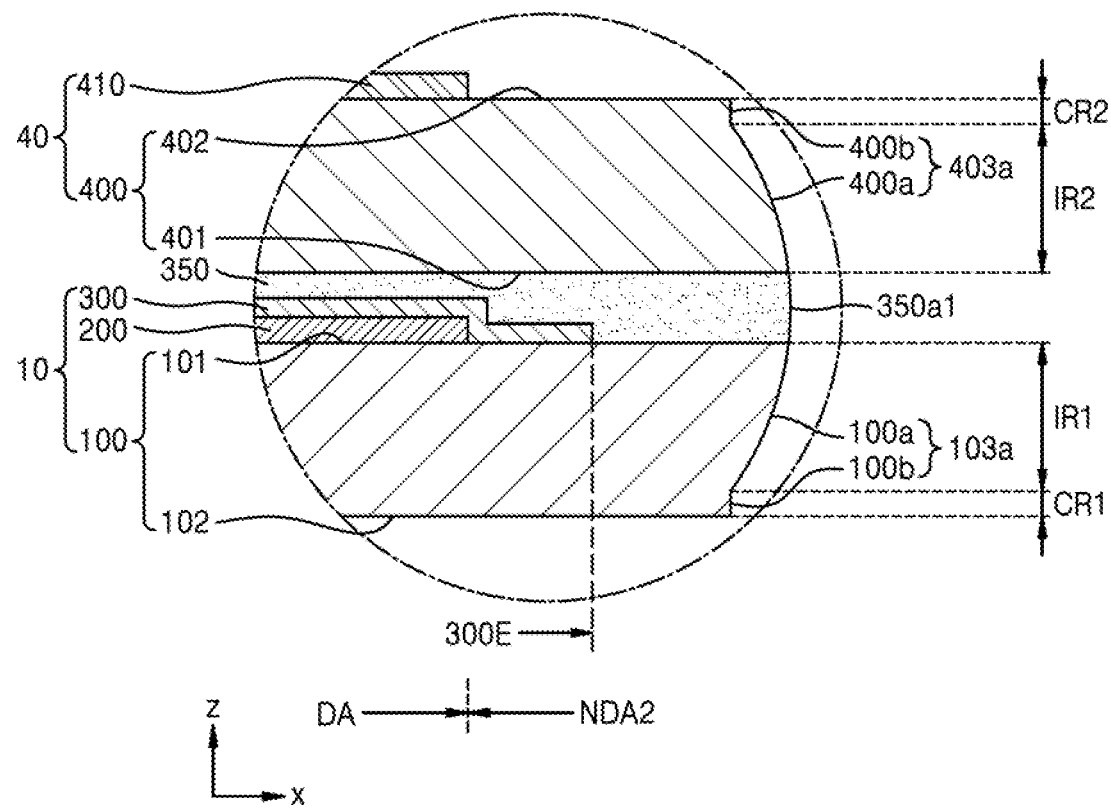
FIG. 11 is an enlarged cross-sectional view of portion XI of FIG. 10.

FIG. 10 is a cross-sectional view of a display device according to an embodiment, and FIG. 11 is an enlarged cross-sectional view of a portion XI of FIG. 10. The cross-section of FIG. 10 corresponds to a cross-section taken along a line X-X' shown in each of FIGS. 4 and 7.

Referring to FIGS. 10 and 11, according to an embodiment, the display device 1 includes a display panel 10 and an input sensing member 40, and the display panel 10 includes a display layer 200 positioned on a substrate 100 that includes a plurality of pixels and a thin-film encapsulation layer 300 that covers the display layer 200. The substrate 100 includes a first inner surface 101 on which the display layer 200 is positioned, and a first outer surface 102 that is opposite to the first inner surface 101.

According to an embodiment, the input sensing member 40 is positioned on the display panel 10. The input sensing member 40 includes a base layer 400 that faces and overlaps the substrate 100 of the display panel 10. The base layer 400 includes a second inner surface 401 that faces the first inner surface 101, and a second outer surface 402 that is opposite to the second inner surface 401. A sensor layer 410 that includes sensing electrodes is positioned on the second outer surface 402 of the base layer 400. The sensor layer 410 includes a first conductive layer ML1 and a second conductive layer ML2, which have been described above with reference to FIGS. 9A and 9B. The sensor layer 410 includes a first insulating layer 403 are positioned over the first conductive layer ML1 and under the second conductive layer ML2, and a second insulating layer 405 positioned over the second conductive layer ML2, which have been described above with reference to FIG. 8.

According to an embodiment, a resin layer 350, such as an optically clean resin (OCR) layer, is interposed between the display panel 10 and the input sensing member 40. The resin layer 350 can be distinguished from a film type adhesive that has a uniform thickness. The resin layer 350 includes a photo-curable resin, such as an UV curable resin. The resin layer 350 includes an acryl-based resin, such as an acryl ester-based material.

According to an embodiment, the resin layer 350 has different thicknesses in different areas. For example, the thickness of a first part of the resin layer 350 that corresponds to the display area DA is less than the thickness of a second part of the resin layer 350 that corresponds to the non-display area NDA. In this regard, FIG. 10 illustrates that a first thickness t of the first part of the resin layer 350 that corresponds to the display area DA is less than a second thickness T of the second part of the resin layer 350 that corresponds to the second non-display area NDA2.

According to an embodiment, an edge of the resin layer 350 extends further outward than an edge of the thin-film encapsulation layer 300. For example, as shown in FIGS. 10 and 11, the resin layer 350 extends outwards, for example, away from the display area DA. The resin layer 350 extends beyond an edge 300E of the thin-film encapsulation layer 300.

According to an embodiment, the input sensing member 40 is formed after the display panel 10 is formed and after the resin layer 350 on the display panel 10 is formed. For example, the input sensing member 40 is manufactured by placing the base layer 400 on the resin layer 350 and forming the sensor layer 410 on the base layer 400. The resin layer 350 is cured before the sensor layer 410 is formed.

According to an embodiment, after a plurality of units that each include the display panel 10 and the input sensing member 40 are formed on a motherboard, each of the plurality of units is cut so that a display device can be manufactured. In this case, cut surfaces, such as side surfaces of the substrate 100 and side surfaces of the base layer 400, each includes a straight line part or flat surface part and a curved part or a curved surface part.

As shown in FIG. 11, according to an embodiment, the substrate 100 includes a first constant part CR1 that has a uniform or constant width along a +z direction from the first outer surface 102 toward the first inner surface 101 and a first variable part IR1 that has a width that increases along the +z direction from the first outer surface 102 toward the first inner surface 101. Here, the width represents a length in the x-direction.

According to an embodiment, a first side surface 103a that connects the first inner surface 101 to the first outer surface 102 includes a plurality of sub-side surfaces, i.e., a first variable side surface 100a adjacent to the first inner surface 101 and a first uniform side surface 100b adjacent to the first outer surface 102. The first variable side surface 100a includes a curved surface that is a side surface of the first variable part IR1 of the substrate 100. The first uniform side surface 100b is a side surface of the first constant part CR1 of the substrate and includes a surface substantially perpendicular to the first outer surface 102.

Similarly, according to an embodiment, the base layer 400 includes a second constant part CR2 that has a uniform or constant width along a −z direction from the second outer surface 402 toward the second inner surface 401 and a second variable part IR2 having a width that increases along the −z direction from the second outer surface 402 toward the second inner surface 401. A second side surface 403a that connects the second inner surface 401 to the second outer surface 402 includes a plurality of sub-side surfaces, i.e., a second variable side surface 400a adjacent to the second inner surface 401 and a second uniform side surface 400b adjacent to the second outer surface 402. The second variable side surface 400a is a side surface of the second increase part IR2 of the base layer 400 that includes a curved surface. The second uniform side surface 400b is a side surface of the second constant part CR2 of the base layer 400 that is substantially perpendicular to the second outer surface 402.

The ratio of a thickness of the first variable part IR1 of the substrate 100 with respect to a thickness of the first constant part CR1 of the substrate 100 in the +z-direction of the substrate 100 is relatively large. In the +z direction of the substrate 100, a thickness of the first variable part IR1 is greater than a thickness of the first constant part CR1. For example, in the +z direction of the substrate 100, a thickness of the first constant part CR1 is equal to or less than half of a thickness of the first variable part IR1. Similarly, the ratio of a thickness of the second variable part IR2 of the base layer 400 with respect to a thickness of the second constant part CR2 of the base layer 400 in the −z-direction of the base layer 400 is relatively large. In a −z direction of the base layer 400, a thickness of the second variable part IR2 is greater than a thickness of the second constant part CR2. For example, in the −z direction of the base layer 400, a thickness of the second constant part CR2 is equal to or less than half of a thickness of the second variable part IR2.

According to an embodiment, in the second non-display area NDA2, a first side surface 350a1 of the resin layer 350 between the substrate 100 and the base layer 400 forms a continuous surface with a side surface of the substrate 100 and a side surface of the base layer 400. For example, the first side surface 350a1 of the resin layer 350 forms a continuous surface with the first variable side surface 100a of the substrate 100 and the second variable side surface 400a of the base layer 400.

According to an embodiment, the display device 1 has a shape in which side surfaces of the display device 1 in the second non-display area are convex outwards, as shown in FIG. 10. When the side surfaces of the display device 1 are convex, a probability that the display device 1 is damaged due to external shocks is significantly reduced compared to the case where the side surfaces of the display device are flat and perpendicular to the first outer surface 102 of the substrate 100 or the second outer surface 402 of the base layer 400. This is because the side surfaces of the display device 1 are approximately convex, and effects similar to those exhibited by an arch structure are produced to improve shock resistance, in particular, strength with respect to side shock. Thus, a display device having excellent shock resistance can be implemented.

According to an embodiment, the shape of side surfaces of the display device 1 described with reference to FIGS. 10 and 11 will be understood as being applicable to side surfaces of the display device 1 that correspond to first through fourth edges 10E1, 10E2, 10E3, and 10E4 of the display panel 10 described above with reference to FIG. 4. The shape of a side surface of the display device 1 that corresponds to the rounded edge 10C of the display panel 10 differs from the shape described above with reference to FIGS. 10 and 11.

Figure 12:
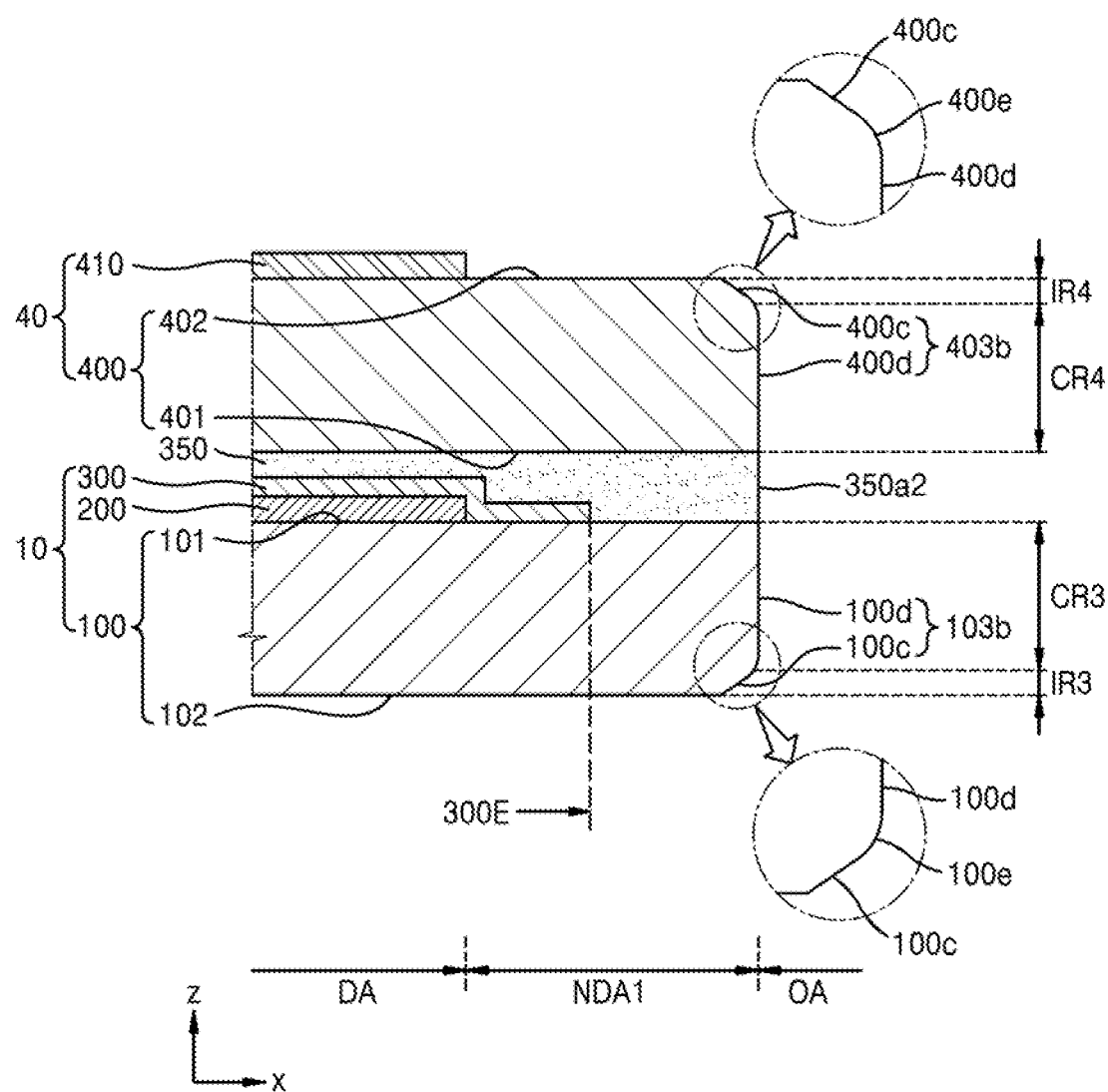
FIG. 12 is a cross-sectional view of a display device according to an embodiment.

FIG. 12 is a cross-sectional view of a display device according to an embodiment.

As shown in FIG. 12, according to an embodiment, a cross-section of tie substrate 100 and the base layer 400 of a peripheral part of the first non-display area NDA1 adjacent to the opening area OA, has a different shape from that of a cross-section of the substrate 100 and the base layer 400 of a peripheral part of the second non-display area NDA2 described with reference to FIG. 11.

According to an embodiment, the substrate 100 include a third variable part IR3 that has a width that increases along a +z direction from the first outer surface 102 toward the first inner surface 101 and a third constant part CR3 that has a uniform width along the +z direction from the first outer surface 102 to the first inner surface 101. Here, the width represents a length in the x-direction.

According to an embodiment, a third side surface 103b that connects the first inner surface 101 and the first outer surface 102 of the substrate 100 includes a plurality of sub-side surfaces, i.e., a third variable side surface 100c adjacent to the first outer surface 102 and a third uniform side surface 100d adjacent to the first inner surface 101. The third variable side surface 100c is a side surface of the third variable part IR3 of the substrate 100 that is inclined with respect to the first outer surface 102, and the third uniform side surface 100d is a side surface of the third constant part CR3 of the substrate 100 that is substantially perpendicular to the first inner surface 101. The first variable side surface 100a described above with reference to FIG. 11 includes a curved surface, whereas the third variable side surface 100c includes a comparatively flat, inclined surface. As such, the shape of the third variable side surface 100c and the shape of the first variable side surface 100a differ from each other.

According to an embodiment, a fourth side surface 403b connects the second inner surface 401 to the second outer surface 402 of the base layer 400 and includes a plurality of sub-side surfaces, i.e., a fourth variable side surface 400c adjacent to the second outer surface 402 and a fourth uniform side surface 400d adjacent to the second inner surface 401. The fourth variable side surface 400c is a side surface of the fourth increase portion IR4 of the base layer 400 that is inclined with respect to the second outer surface 402, and the fourth uniform side surface 400d is a side surface of the fourth constant part CR4 of the base layer 400 that is substantially perpendicular to the second inner surface 401. The second variable side surface 400a described above with reference to FIG. 11 includes a rounded or curved surface, whereas the fourth variable side surface 400c includes a comparatively flat, inclines surface. As such, the shape of the fourth variable side surface 400c differs from the shape of the second variable side surface 400a.

According to an embodiment, the ratio of a thickness of the third variable part IR3 of the substrate 100 with respect to a thickness of the third constant part CR3 of the substrate 100 in the +z-direction of the substrate 100 is relatively small. In the +z-direction of the substrate 100, a thickness of the third variable part IR3 is less than a thickness of the third constant part CR3. For example, in the +z-direction of the substrate 100, a thickness of the third variable part IR3 is equal to or less than half of a thickness of the third constant part CR3. Similarly, the ratio of a thickness of the fourth variable part IR4 of the base layer 400 with respect to a thickness of the fourth constant part CR4 of the base layer 400 in the −z-direction of the base layer 400 is relatively small. In the −z-direction of the base layer 400, a thickness of the fourth variable part IR4 is less than a thickness of the fourth constant part CR4. For example, in the −z-direction of the base, layer 400, a thickness of the fourth variable part IR4 is equal to or less than half of a thickness of the fourth constant part CR4.

According to an embodiment, in the first non-display area NDA1, the second side surface 350a2 of the resin layer 350 between the substrate 100 and the base layer 400 forms a continuous surface with a side surface of the substrate 100 and a side surface of the base layer 400. For example, the second side surface 350a2 of the resin layer 350 forms a continuous surface with the third uniform side surface 100d of the substrate 100 and the fourth uniform side surface 400d of the base layer 400.

Referring to the enlarged view of FIG. 12, according to an embodiment, a part that connects the third variable side surface 100c and the third uniform side surface 100d of the substrate 100 includes a rounded or curved surface 100e, and a part that connects the fourth variable side surface 400c and the fourth uniform side surface 400d of the base layer 400 also includes a rounded or curved surface 400e.

Figure 13A:
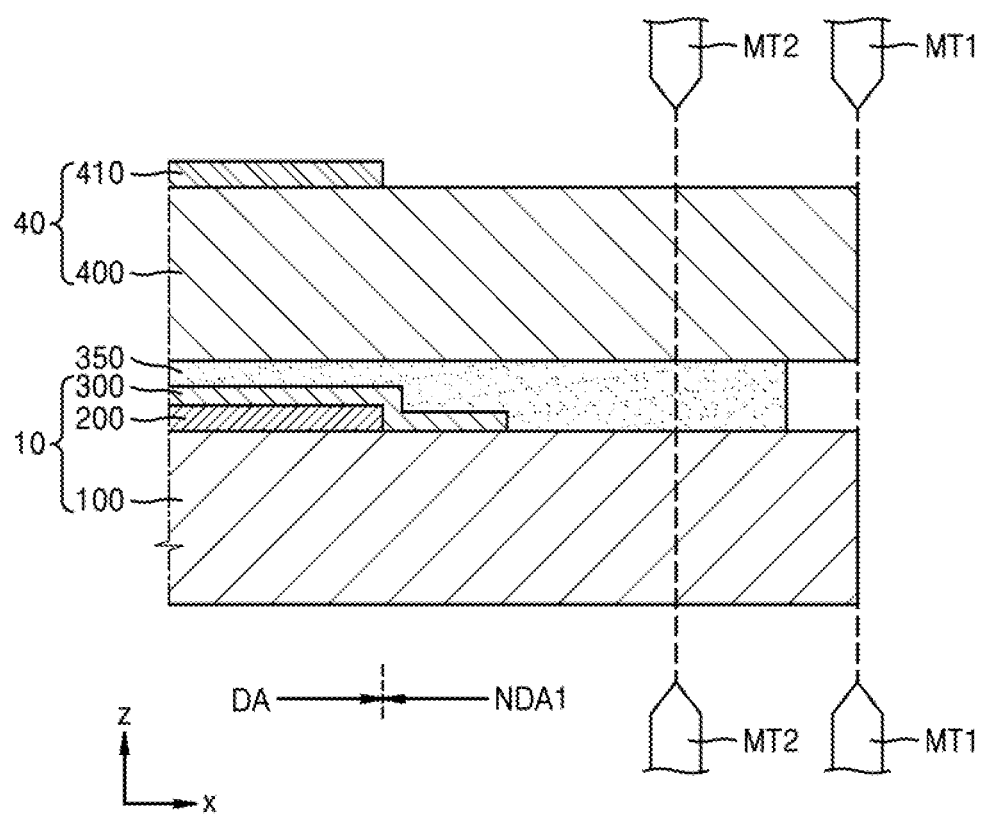
FIGS. 13A and 13B are cross-sectional views that illustrate a manufacturing process of a display device according to an embodiment.
Figure 13B:
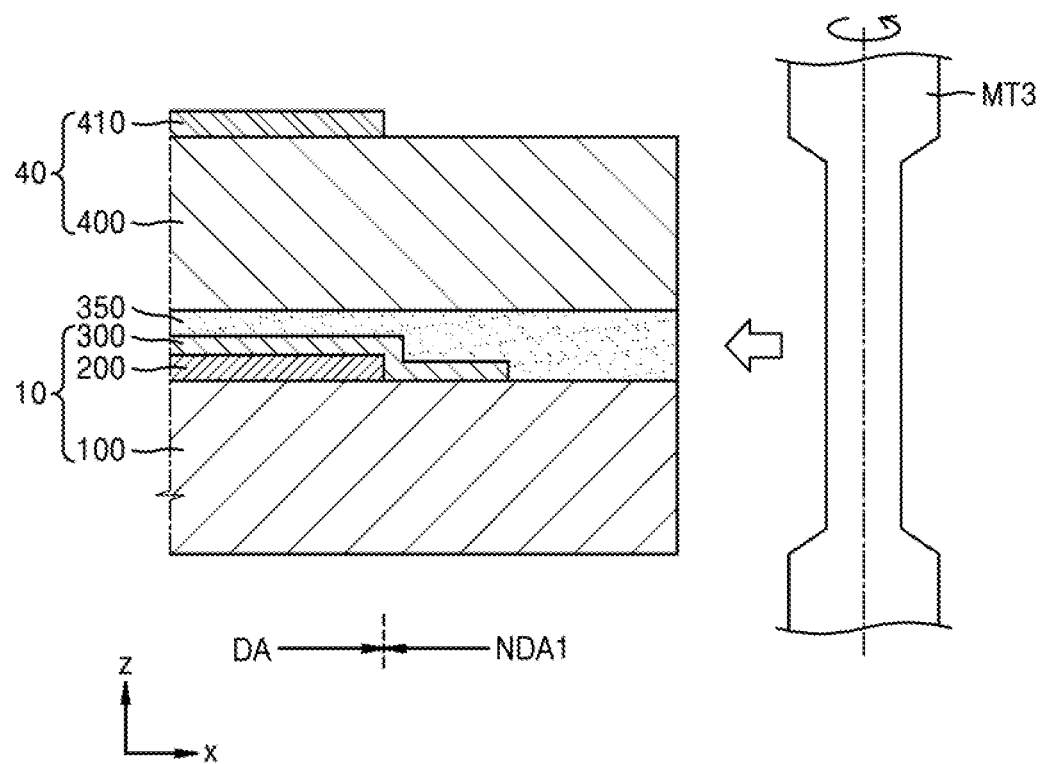

FIGS. 13A and 13B are cross-sectional views that illustrate a manufacturing process of a display device according to an embodiment. FIGS. 13A and 13B illustrate a process that forms an opening area OA.

Referring to FIG. 13A, according to an embodiment, after a display layer 200 and a thin-film encapsulation layer 300 are sequentially formed on a substrate 100, a material for forming the resin layer 350 is disposed on the substrate 100. Subsequently, after the base layer 400 is formed, the resin layer 350 is cured, for example, UV-cured, and a sensor layer 410 is formed on the base layer 400.

Next, according to an embodiment, after a predetermined line is formed in each of the substrate 100 and the base layer 400 by using a first tool MT1, a part to the right of the predetermined line in FIG. 13A is separated from the part to the left of the predetermined line in FIG. 13A. Subsequently, a laser beam is irradiated a second tool MT2 that penetrates through the substrate 100, the resin layer 350, and the base layer 400 so that a display device is cut.

Subsequently, according to an embodiment, as shown in FIG. 13B, the cut side surfaces of the display device, such as side surfaces of the substrate 100, the resin layer 350, and the base layer 400, are polished by a third tool MT3. The third tool MT3 rotates in place so that side surfaces of the third tool MT3 are in contact with the side surfaces of the display device. The side surfaces of the substrate 100, the resin layer 350, and the base layer 400 completed using a polishing process are the same as those described with reference to FIG. 12.

According to an embodiment, a side surface of the display device that surrounds the opening area OA is formed using the process described with reference to FIGS. 13A and 13B. However, the other side surfaces of the display device are formed using a different process that will be described next.

Figure 14:
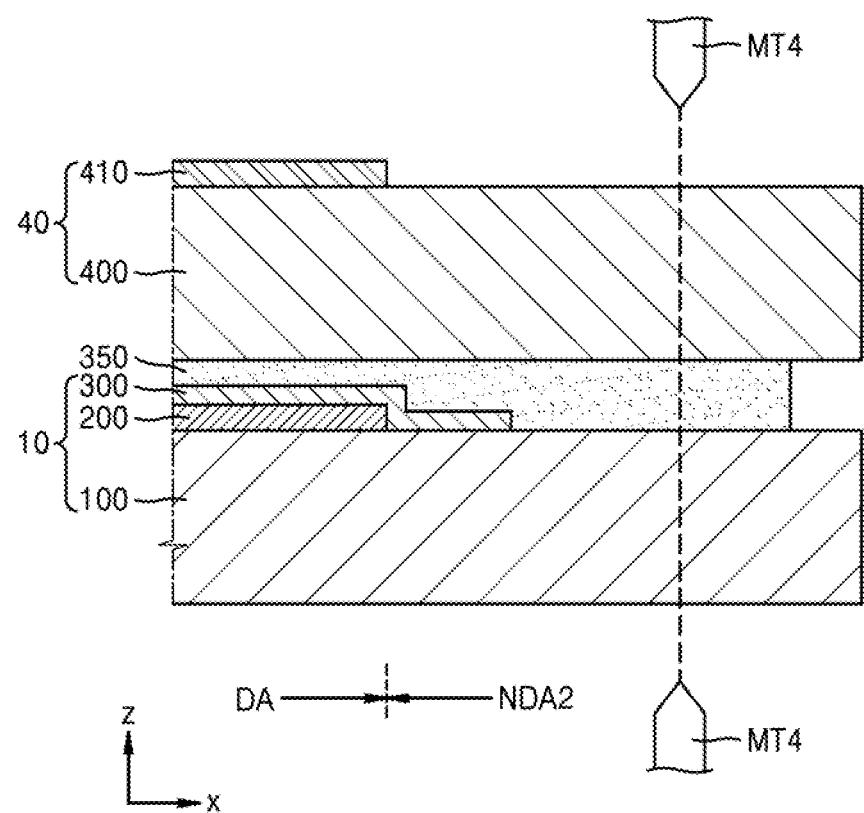
FIG. 14 is a cross-sectional view that illustrates a manufacturing process of a display device according to an embodiment.

FIG. 14 is a cross-sectional view that illustrates a manufacturing process of a display device according to an embodiment. FIG. 14 illustrates a cross-section of the side surface that does not surround the opening area OA of the display device, i.e., a cross-section of the display device in the second non-display area NDA2.

Referring to FIG. 14, according to an embodiment, after an input sensing member 40 is formed on a display panel 10, the structure that includes the display panel 10 and the input sensing member 40 is cut using a fourth tool MT4. A optional process of finely polishing the cut surface may be performed. The fourth tool MT4 is a cutting device, such as a wheel. The cutting process is performed along a virtual line that passes through the substrate 100, the resin layer 350, and the base layer 400. The cut side surfaces of the display device are the same as the side surfaces described above with reference to FIGS. 10 and 11.

Figure 15:
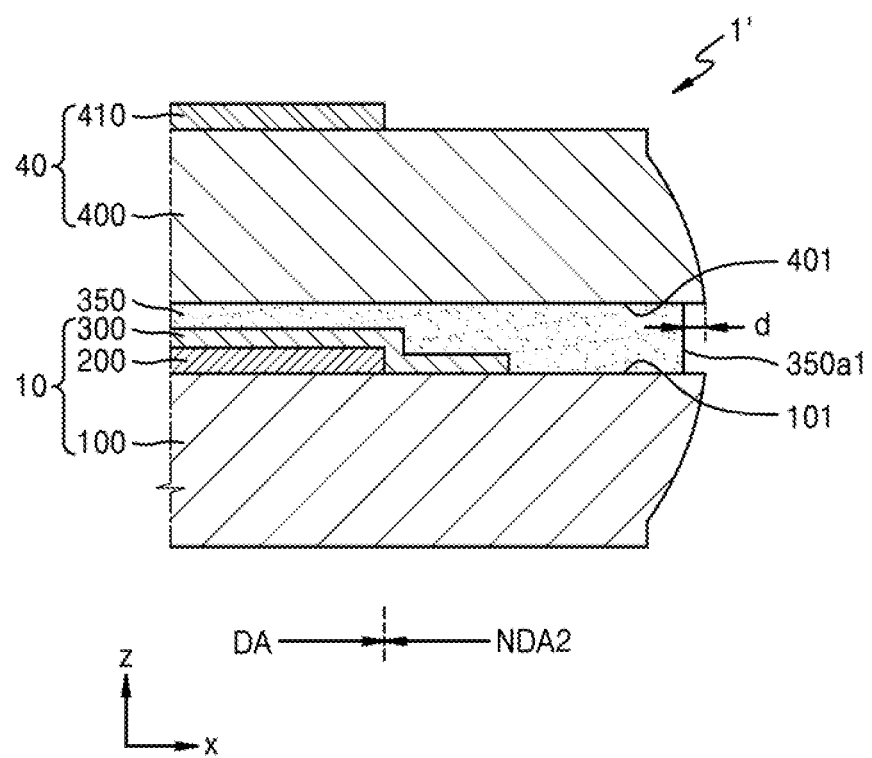
FIG. 15 is a cross-sectional view of a display device according to another embodiment.

FIG. 15 is a cross-sectional view a display device according to another embodiment.

Referring to FIG. 15, according to an embodiment, the other features of a display device 1' are the same as those described above except for a difference between the position of a side surface of a resin layer 350 of FIG. 15 and that of the display device 1 described above with reference to FIGS. 10 through 11. Thus, hereinafter, the differences therebetween will be described.

Referring to FIG. 15, according to an embodiment, a first side surface 350a1 of the resin layer 350 does not form a continuous surface with a side surface of the substrate 100 and a side surface of the base layer 400. For example, the first side surface 350a of the resin layer 350 in the second non-display area NDA2 is positioned on a different surface from the first variable side surface 100a of the substrate 100 and the second variable side surface 400a of the base layer 400. The first side surface 350a of the resin layer 350 may be positioned inward from distal edges of the first inner surface 101 of the substrate 100 and the second inner surface 401 of the base layer 400 by a first distance d. The first distance d is about 100 μm or less.

Figure 16A:
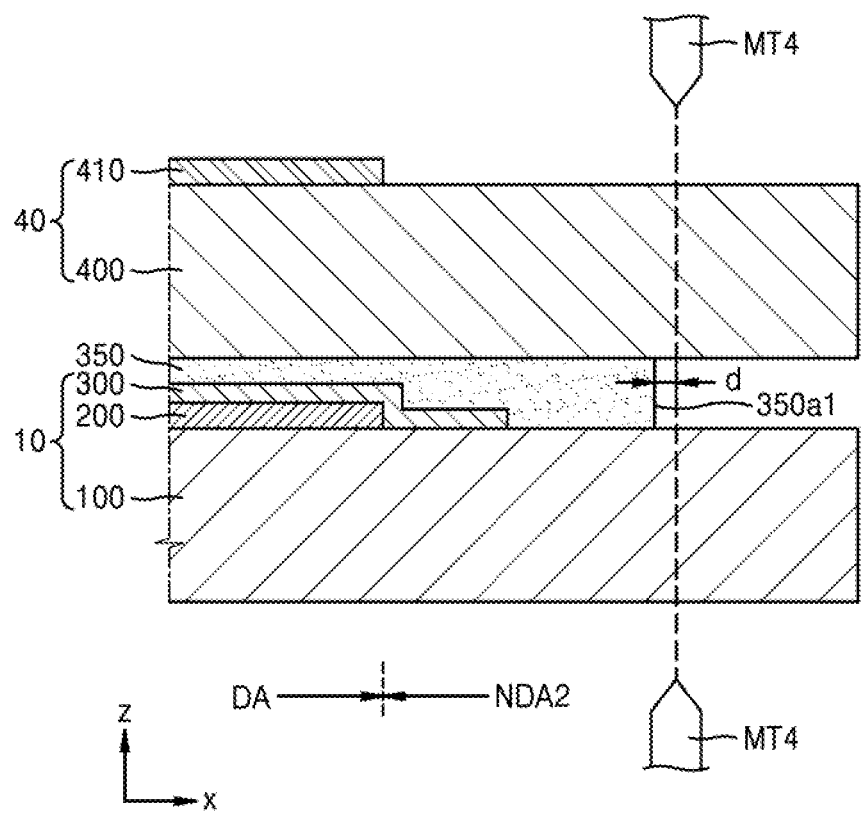
FIGS. 16A and 16B are cross-sectional views that illustrate a manufacturing process of a display device according to another embodiment.
Figure 16B:
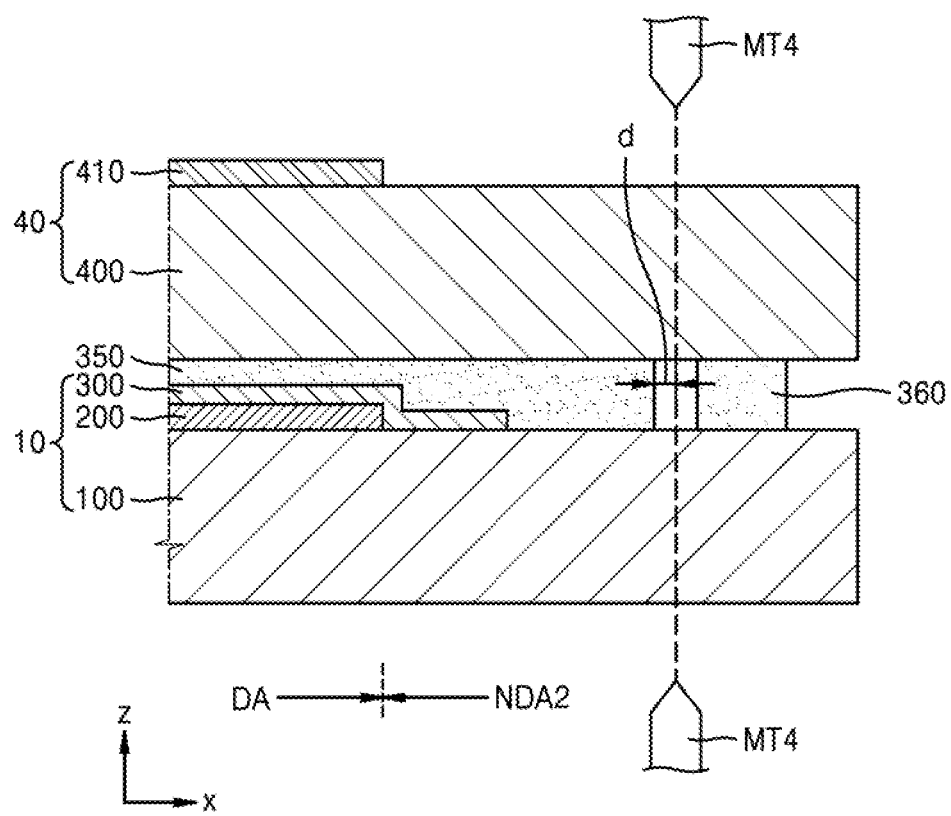

FIGS. 16A and 16B are cross-sectional views that illustrate a manufacturing process of a display device according to another embodiment FIGS. 16A and 16B illustrate a cross-section of side surfaces that do not surround the opening area OA of the display device, i.e., a cross-section of the display device in the second non-display area NDA2.

Referring to FIG. 16A, according to an embodiment, cutting using the four fourth tool MT4 is performed along a line that does not pass through the resin layer 350. For example, as shown in FIG. 16A, a fourth line L4' is spaced outward from the first side surface 350a of the resin layer 350 outwards by the first distance d.

According to an embodiment, after a line is formed on the substrate 100 and the base layer 400 using the fourth tool MT4, a part to the right of the line is separated from a part to the left of the line in FIG. 16A). The first distance d is about 100 μm or less. When the first distance d is out of the above-described range, cracks or a lifting defect can occur in the display layer 200 due to forces applied during manufacture of the display device, and foreign substances, such as sludge, can be generated in a polishing process between the substrate 100 and the base layer 400.

In another embodiment, referring to FIG. 16B, a dummy resin layer 360 is positioned outside the resin layer 350 during a manufacturing process. The dummy resin layer 360 is spaced apart from the resin layer 350 by a predetermined distance, and the cutting process is performed between the resin layer 350 and the dummy resin layer 360. Due to the existence of the dummy resin layer 360, cracks and the lifting defect can be prevented from occurring in the display layer 200 due to forces applied during manufacture of the display device.

Figure 17:
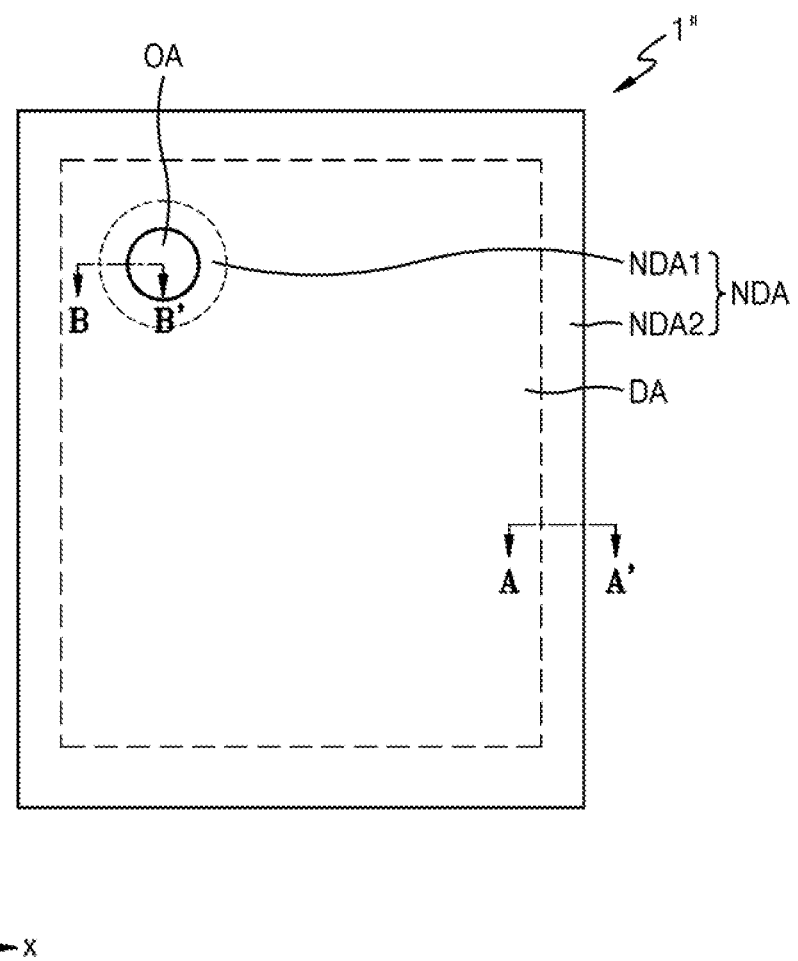
FIG. 17 is a plan view of a display device according to another embodiment.

FIG. 17 is a plan view of a display device according to another embodiment.

In the display device 1 or 1' described above with reference to embodiments of FIGS. 1 through 15, the opening area OA is positioned at one side of the display area DA. However, in another embodiment, the opening area OA of a display device 1" is positioned inside the display area DA. In this case, the first non-display area NDA1 and the second non-display area NDA2 are separate from each other, and the opening area OA is entirely surrounded by the display area DA.

According to an embodiment, the display device 1" includes a display panel and an input sensing member as in the display device 1 described above. A cross-section taken along a line A-A' of FIG. 17 is the same as the cross-section described with reference to FIG. 15, and a cross-section taken along a line B-B' of FIG. 17 is the same as the cross-section described with reference to FIG. 12. Thus, a repeated description thereof will be omitted.

According to embodiments, a durable display panel can be provided, in which the occurrence of defects during a manufacturing process of the display device can be prevented, and the reliability of the display device can be improved. However, these effects are illustrative, and the scope of the present disclosure is not limited thereto.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display device, comprising:
    a display panel that includes a substrate, a display layer disposed on the substrate, and a thin-film encapsulation layer that covers the display layer;
    an input sensing member that includes a base layer and sensing electrodes disposed on the base layer, wherein the base layer faces the substrate of the display panel; and
    a resin layer disposed between the thin-film encapsulation layer and the base layer, wherein
    the display device includes an opening area and a display area that at least partially surrounds the opening area, and
    a side surface of the substrate that at least partially surrounds the opening area includes a portion having a rounded shape in a first cross-sectional view of the substrate that differs from a rounded shape in a second cross-sectional view of a side surface of another part of the substrate.

2. The display device of claim 1, wherein the resin layer includes an ultraviolet (UV) curable material.

3. The display device of claim 1, wherein the resin layer extends toward an edge of the substrate beyond an edge of the thin-film encapsulation layer.

4. The display device of claim 1, wherein the thin-film encapsulation layer includes at least one inorganic encapsulation layer and at least one organic encapsulation layer.

5. The display device of claim 1, wherein the input sensing member includes
    a first conductive layer,
    a second conductive layer disposed on the first conductive layer, and
    a first insulating layer disposed between the first conductive layer and the second conductive layer.

6. The display device of claim 5, wherein the first conductive layer is in direct contact with the base layer.

7. The display device of claim 1, wherein
    a side surface of the base layer that at least partially surrounds the opening area includes a portion having a rounded shape in the first cross-sectional view of the base layer that differs from a rounded shape in the second cross-sectional view of a side surface of another part of the base layer.

8. The display device of claim 1, wherein a side surface of the resin layer forms a continuous surface with side surfaces of the substrate and the base layer.

9. The display device of claim 1, wherein a side surface of the resin layer is spaced inward toward the display layer from side surfaces of the substrate and the base layer.

10. A display device, comprising:
    a substrate that includes a first inner surface and a first outer surface that is opposite to the first inner surface;
    a display layer disposed on the first inner surface of the substrate;
    a thin-film encapsulation layer that covers the display layer;
    a base layer that includes a second inner surface that faces the first inner surface and a second outer surface that is opposite to the second inner surface; and
    a resin layer disposed between the thin-film encapsulation layer and the base layer, wherein
    the display device includes an opening area and a display area that at least partially surrounds the opening area,
    the base layer includes a third side surface that at least partially surrounds the opening area and a fourth side surface that differs from the third side surface, and the third side surface includes a portion having a rounded shape in a first cross-sectional view of the base layer that differs from a rounded shape in a second cross-sectional view of the fourth side surface.

11. The display device of claim 10, wherein the resin layer is transparent and includes a ultraviolet (UV) curable resin.

12. The display device of claim 10, wherein the resin layer extends toward an edge of the substrate and an edge of the base layer beyond an edge of the thin-film encapsulation layer.

13. The display device of claim 10, further comprising a sensor layer positioned on the base layer and that includes first sensing electrodes and second sensing electrodes.

14. The display device of claim 10, wherein
    the substrate includes a first side surface that at least partially surrounds the opening area and a second side surface that differs from the first side surface, and
    the first side surface has a shape in a thickness direction of the substrate that differs from that of the second side surface.

15. The display device of claim 14, wherein
    the first side surface of the substrate includes a first inclined surface adjacent to the first outer surface of the substrate, and
    the third side surface of the base layer includes a second inclined surface adjacent to the second outer surface of the base layer.

16. The display device of claim 14, wherein
    the second side surface of the substrate comprises a first curved surface adjacent to the first inner surface of the substrate, and
    the fourth side surface of the base layer comprises a second curved surface adjacent to the second inner surface of the base layer.

17. The display device of claim 15, wherein a side surface of the resin layer forms a continuous surface with the first side surface and the second side surface.

18. The display device of claim 15, wherein a side surface of the resin layer forms a continuous surface with the third side surface and the fourth side surface or
    is positioned inward from the third side surface and the fourth side surface.

19. A display device, comprising:
    a substrate that includes a first inner surface and a first outer surface that is opposite to the first inner surface; and
    a base layer that includes a second inner surface that faces the first inner surface and a second outer surface that is opposite to the second inner surface, wherein
    the display device includes an opening area and a display area that at least partially surrounds the opening area, the substrate includes a first side surface that at least partially surrounds the opening area and a second side surface that differs from the first side surface, and the base layer includes a third side surface that at least partially surrounds the opening area and a fourth side surface that differs from the third side surface, and the first side surface includes a portion having a rounded shape in a first cross-sectional view of the substrate that differs from a rounded shape in a second cross-sectional view of the second side surface, and the third side surface includes a portion having a rounded shape in the first cross-sectional view of the base layer that differs from a rounded shape in the second cross-sectional view of the fourth side surface.

20. The display device of claim 19, further comprising:

a display layer disposed on the first inner surface of the substrate;

a thin-film encapsulation layer that covers the display layer; and a resin layer disposed between the thin-film encapsulation layer and the base layer.

* * * * *